US009800260B1

(12) United States Patent
Banerjee

(10) Patent No.: US 9,800,260 B1
(45) Date of Patent: Oct. 24, 2017

(54) METHOD AND APPARATUS TO INCREASE DYNAMIC RANGE IN DELTA-SIGMA ADC USING INTERNAL FEEDBACK ACROSS ALL INTEGRATORS IN LOOP-FILTER

(71) Applicant: Analog Devices Global, Hamilton (BM)

(72) Inventor: Debopam Banerjee, Bangalore (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/343,674

(22) Filed: Nov. 4, 2016

(51) Int. Cl.
*H04B 1/38* (2015.01)
*H03M 3/00* (2006.01)
*H03M 1/12* (2006.01)
*H04B 1/00* (2006.01)
*H03M 1/00* (2006.01)

(52) U.S. Cl.
CPC .......... *H03M 3/412* (2013.01); *H03M 1/124* (2013.01); *H03M 3/458* (2013.01); *H04B 1/0017* (2013.01); *H04B 1/38* (2013.01)

(58) Field of Classification Search
CPC ....... H03M 3/412; H03M 1/124; H03M 3/458
USPC ............................................ 341/141; 455/73
See application file for complete search history.

(56) References Cited

U.S. PATENT DOCUMENTS

| 7,573,948 | B2* | 8/2009 | Jensen | H04B 1/0007 375/295 |
| 2008/0074302 | A1* | 3/2008 | Akizuki | H03M 3/47 341/141 |
| 2014/0368365 | A1* | 12/2014 | Quiquempoix | H03M 3/496 341/143 |

* cited by examiner

*Primary Examiner* — Ayodeji Ayotunde
(74) *Attorney, Agent, or Firm* — Schwegman Lundberg & Woessner, P.A.

(57) ABSTRACT

An apparatus comprises a delta-sigma analog-to-digital converter (ADC) and baseband processing circuitry. The delta-sigma ADC includes a plurality of integrator stages connected in series, including a first integrator stage operatively coupled to an input of the delta-sigma ADC; a main quantizer circuit including a main ADC circuit and a main digital-to-analog converter (DAC) circuit, wherein an input to the main ADC circuit is operatively coupled to the plurality of integrator stages; and a first feedback circuit path operatively coupled from an output of the first integrator stage to the input of the delta-sigma ADC, wherein the first feedback circuit path is configured to subtract an output voltage of the first integrator stage from the input of the delta-sigma ADC. The baseband circuitry is configured to activate the first feedback circuit path when detecting that the input voltage increases to cause distortion in the delta-sigma ADC.

24 Claims, 5 Drawing Sheets

METHOD AND APPARATUS TO INCREASE DYNAMIC RANGE IN DELTA-SIGMA ADC USING INTERNAL FEEDBACK ACROSS ALL INTEGRATORS IN LOOP-FILTER

BACKGROUND

Electronic systems can include analog-to-digital (A/D) converters (ADCs). Converting analog signals to digital quantities allows processors of electronic systems to perform signal processing functions for the systems. The delta-sigma ADC is one type of ADC and is widely used in converting signals in the audio band, in precision industrial measurement applications, and in narrow band internet of things (IoT) applications. Amplitude of the input voltage may limit performance of an integrated circuit delta-sigma ADC by making it unstable. As the amplitude increases, the quantizer stage can get overloaded resulting in degradation of performance. The present inventors have recognized a need for improving the dynamic range of delta-sigma ADCs.

OVERVIEW

This document relates generally to sigma delta analog-to-digital converter (ADC) circuits, and in particular to improving the dynamic range of ADC circuits. An example apparatus includes a delta-sigma analog-to-digital converter (ADC) and baseband processing circuitry. The delta-sigma ADC includes a plurality of integrator stages connected in series, including a first integrator stage operatively coupled to an input of the delta-sigma ADC; a main quantizer circuit including a main ADC circuit and a main digital-to-analog converter (DAC) circuit, wherein an input to the main ADC circuit is operatively coupled to the plurality of integrator stages; and a first feedback circuit path operatively coupled from an output of the first integrator stage to the input of the delta-sigma ADC, wherein the first feedback circuit path is configured to subtract an output voltage of the first integrator stage from the input of the delta-sigma ADC. The baseband circuitry is configured to activate the first feedback circuit path when detecting that the input voltage increases to cause distortion in the delta-sigma ADC, thereby increasing the dynamic range of the ADC beyond full-scale.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
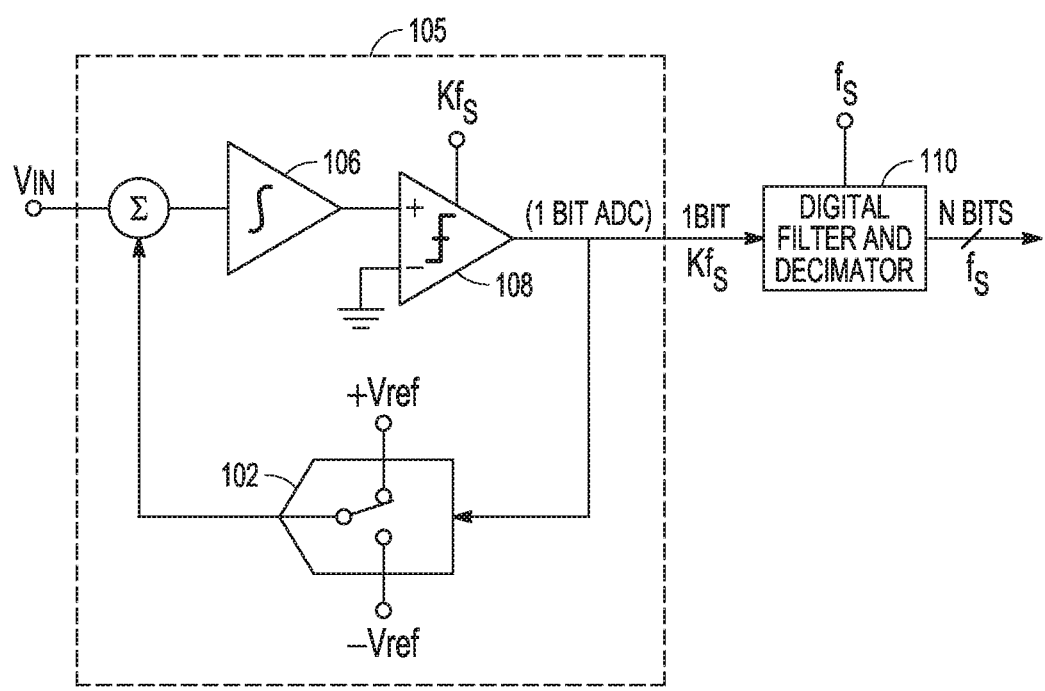
FIG. 1 is a block diagram of an example of a first order delta-sigma ADC circuit.

FIG. 1 is a block diagram of an example of a first order single bit delta-sigma ADC. The ADC 105 converts an input signal (u(t)) into a continuous serial stream of ones and zeros at a rate determined by a sampling clock frequency $Kf_s$. A one-bit digital to analog converter (DAC) 102 is driven by the serial output data stream to generate a feedback signal. The output of the DAC 102 is subtracted from the input signal using a summing element 104. Typically, the summing element 104 is implemented as the summing junction of an operational amplifier (op amp) such as the op amp of the integrator 106. The integrator 106 integrates the output of summing element 104, and the output of the integrator 106 is applied to a clocked latched comparator 108 to produce the one-bit ADC at the output.

Delta-sigma ADC circuits can use comparators to quantize the analog input to a digital value. For example, for a one-bit converter, the quantizer determines whether the input voltage is to be given the value of a one or zero. The quantizers can become overloaded as the amplitude of the input voltage reaches a critical point. This can be especially true for single bit quantizers. For single bit quantizers, the location of the poles in the transfer function is dependent on the input. As the input increases, the poles of the transfer function of the quantizer move out of the unit circle in the z-plane and the quantizer can get overloaded. When the quantizers get overloaded, the integrator or integrators of the loop filter circuit become saturated. This saturation causes signal distortion and reduces the signal to noise plus distortion ratio (SNDR) of the ADC.

Figure 2:
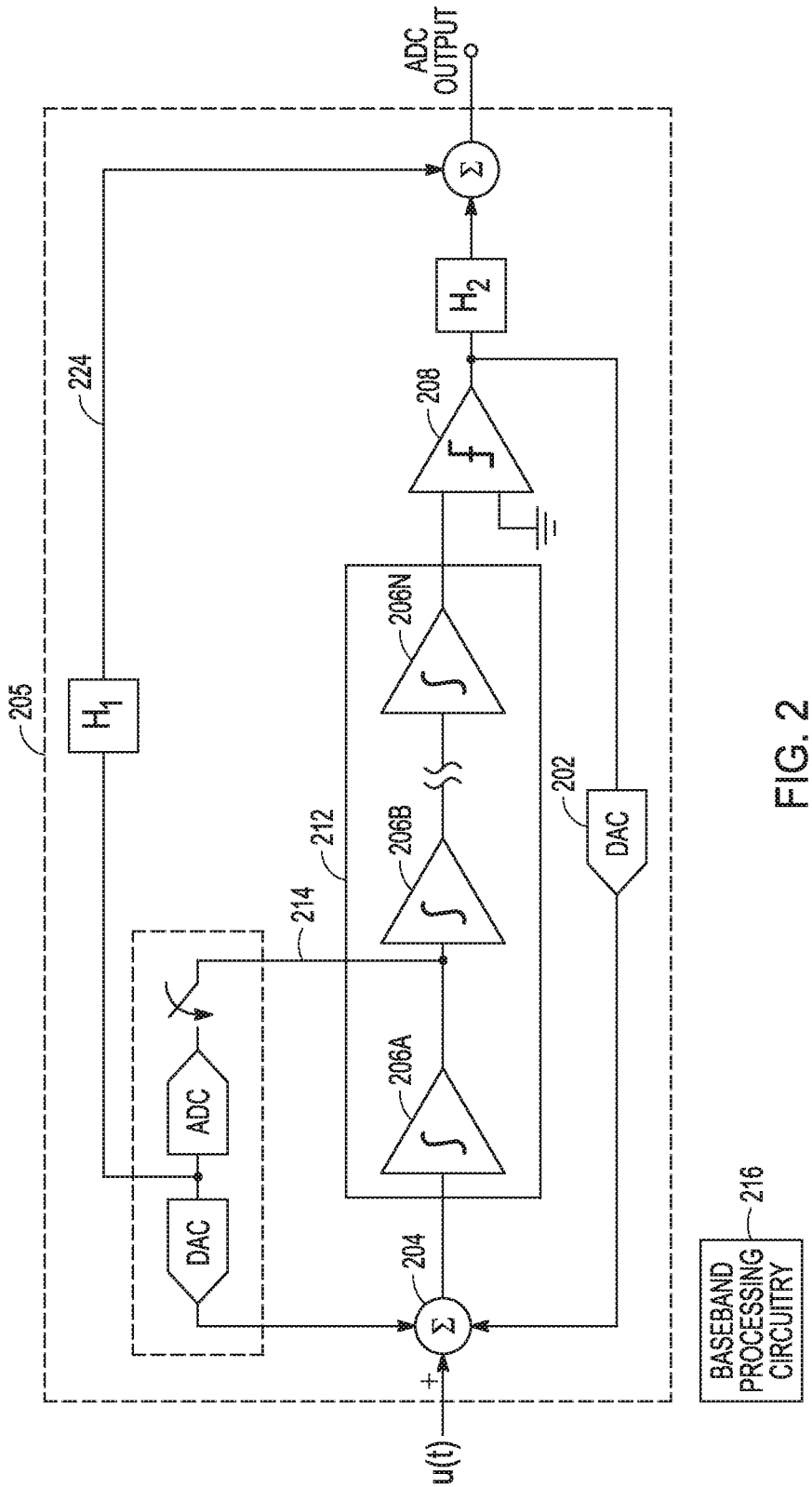
FIG. 2 is a block diagram of portions of another example of a sigma-delta ADC circuit.

FIG. 2 is a block diagram of portions of another example of a sigma-delta ADC circuit. The sigma-delta ADC circuit 205 includes a main ADC circuit 208 or comparator, and a main DAC circuit 202. The main ADC circuit 208 and the main DAC circuit 202 are components of a main quantizer circuit of the delta-sigma ADC. The delta-sigma ADC circuit also has a loop filter circuit 212 that includes multiple integrator stages (206A, 206B . . . 206N) connected in series.

During normal operation, the operational amplifiers (op amps) in the integrator stages do not experience any clipping. However, when the input voltage to the delta-sigma ADC circuit exceeds a maximum stable amplitude (MSA) the op amps can begin to clip at the output. The delta-sigma ADC circuit includes a feedback circuit path 214 connected from an output of the first integrator stage to the input of the delta-sigma ADC circuit. The feedback circuit path 214 may be activated by baseband circuitry 216. The baseband circuitry 216 may include processing circuitry such as a digital baseband processor for example. The baseband circuitry 216 may activate the feedback circuit path when detecting that the input voltage increases to cause distortion in the delta-sigma ADC. The feedback circuit path refers the output of the first integrator stage 206A to the input and subtracts the output voltage of the first integrator from the input of the delta-sigma ADC at summing circuit node 204. Any saturation in subsequent integrators would cause harmonics, but the harmonics are attenuated by the gain of the first op amp referred to the input. This improves the dynamic range of the delta-sigma ADC. To get back the intended performance of the delta-sigma ADC circuit, the signal from the output of the first integrator circuit is quantized and added back in at the output of the sigma-delta ADC circuit. The secondary quantization introduces another error signal into the signal path which needs to be removed from the final output. This can be done by feeding the quantized output from first integrator to a filter which is added back in at the output using feed forward circuit path 224 to mimic the inverse transfer function of the rest of the loop-filter.

Figure 3:
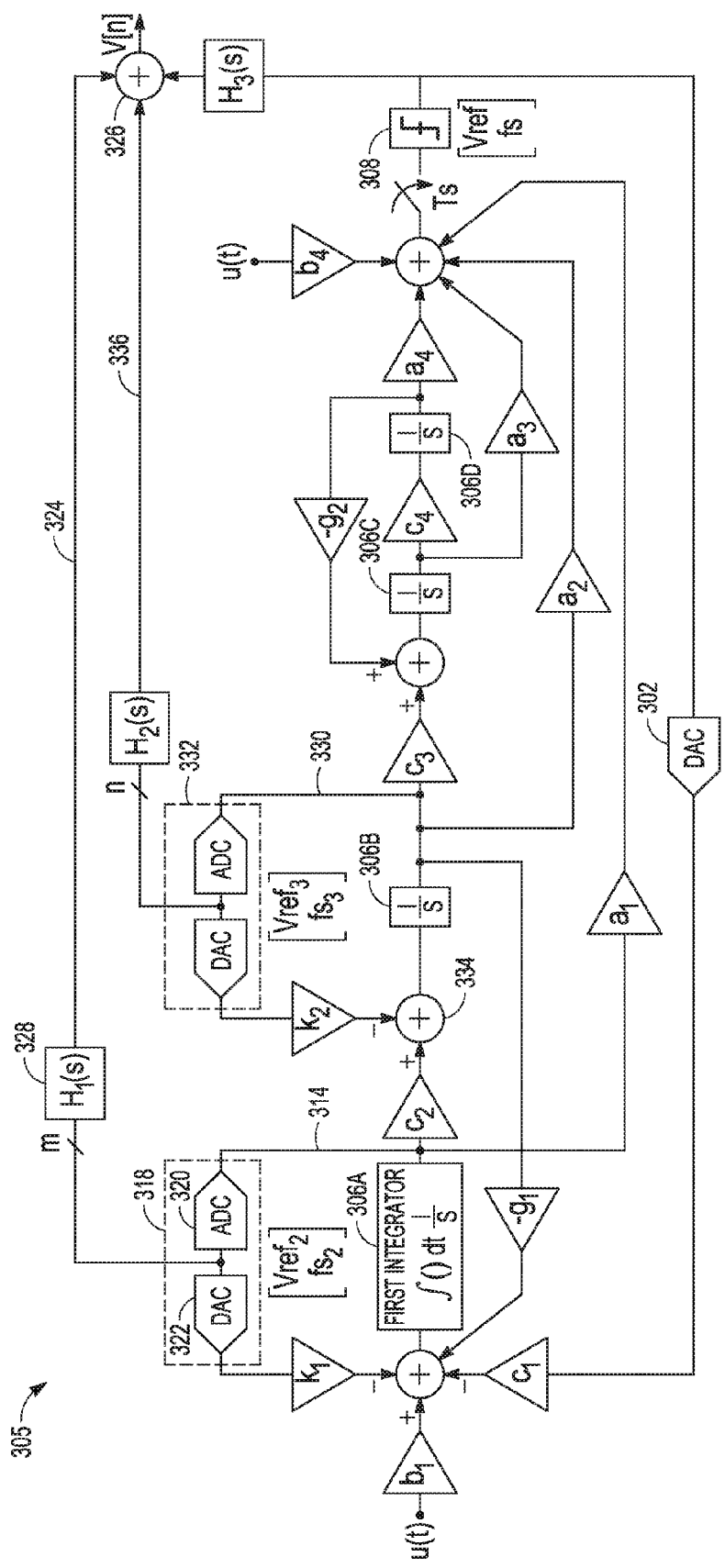
FIG. 3 is a circuit diagram of portions of another example of a sigma-delta ADC circuit.

FIG. 3 is a circuit diagram of portions of another example of a sigma-delta ADC circuit. The delta-sigma ADC circuit 305 includes a main ADC circuit 308, a main DAC circuit 302, and a fourth order loop filter circuit that includes four integrator stages 306A-306D. The delta-sigma ADC circuit includes a feedback circuit path 314 operatively coupled from the output of the first integrator stage 306A to the input of the delta-sigma ADC circuit. The feedback circuit path 314 includes a feedback quantizer circuit 318 comprising a sub-ADC circuit 320 to quantize the output of the first integrator stage and a sub-DAC circuit 322 to produce the voltage that is subtracted from the input at summing circuit node when the feedback circuit path 314 is activated. The feedback quantizer can be the same as the main quantizer or can be different from the main quantizer. For instance, the feedback quantizer may be clocked at a higher rate than the main quantizer. By quantizing the output of the first integrator stage and subtracting it from the input when the input exceeds the MSA, the first integrator stage 306A effectively sees an input equal to the input minus the full-scale reference voltage Vref2 of the feedback quantizer, or u(t)−Vref2. This reduces the voltage that is overloading the integrators.

In normal operation the feedback circuit path is not activated. The feedback circuit path can be activated by baseband circuitry when the baseband processing circuitry detects that the input voltage increases to cause distortion in the delta-sigma ADC. The baseband circuitry may activate the feedback circuit path 314 in response to detecting that the input exceeds the MSA. In some examples, the baseband processing circuitry activates the feedback circuit path 314 in response to detecting that the signal to noise plus distortion ratio (SNDR) is less than a specified (e.g., programmed) SNDR threshold (e.g., when the SNDR decreases below about thirty decibels (30 dB)). In some examples, the baseband circuitry monitors the bit error rate of the delta-sigma ADC circuit 305 and activates the feedback circuit path 314 in response to detecting that the bit error rate of the delta-sigma ADC circuit (or the receiver chain including the ADC) is greater than a specified threshold bit error rate (e.g., 1e-4 errors/bits). The baseband circuitry may activate the feedback circuit path by activating one or more switch circuits to switch the feedback circuit path into the delta-sigma ADC circuit. In variations, the baseband circuitry may activate the feedback circuit path by providing power to the circuit elements of the feedback circuit path when detecting an increase in the input that causes distortion.

The error introduced by feedback quantization and subtraction is present in the final output of the loop filter circuit. To get back the intended performance of the delta-sigma ADC circuit, the output of the feedback quantizer is added back to the main quantizer with the proper filtering. The delta-sigma ADC circuit can include a feed forward circuit path 324 from the feedback quantizer circuit 318 to a summing circuit node 326 at the output of the delta-sigma ADC circuit. The first feed forward circuit path adds the quantized output of the first integrator stage back in at the output using the circuit summing node 326. The coefficients of the transfer function 328 of the feed forward path can be determined using a priori knowledge of the transfer function and coefficients of the loop filter circuit.

The feedback to reduce distortion can be included in more integrator stages than just the first integrator stage. In FIG. 3, the delta-sigma ADC circuit 305 also includes a second feedback circuit path 330 operatively coupled between the output of the second integrator stage 306B and the input to the second integrator stage. The second feedback circuit path 330 includes a second feedback quantizer circuit 332. When activated, the feedback circuit path subtracts a quantized output of the second integrator stage from the input of the second integrator stage using summing circuit node 334. A second feed forward path 336 from the second quantizer to the summing circuit node 326 at the output can be used to add back in the output of the second feedback quantizer. The second feedback circuit path 330 and the second feed forward circuit path 336 may be activated by baseband circuitry under the same conditions as the first feedback circuit path 314 or different thresholds may be used to selectively activate the second feedback circuit path and second feed forward circuit path. Additional internal feedback can be added to the subsequent integrator stages, but adding feedback to the subsequent integrator stages may produce less benefit because any further distortion is attenuated by the gain provided by the first and second integrator stages.

Figure 4:
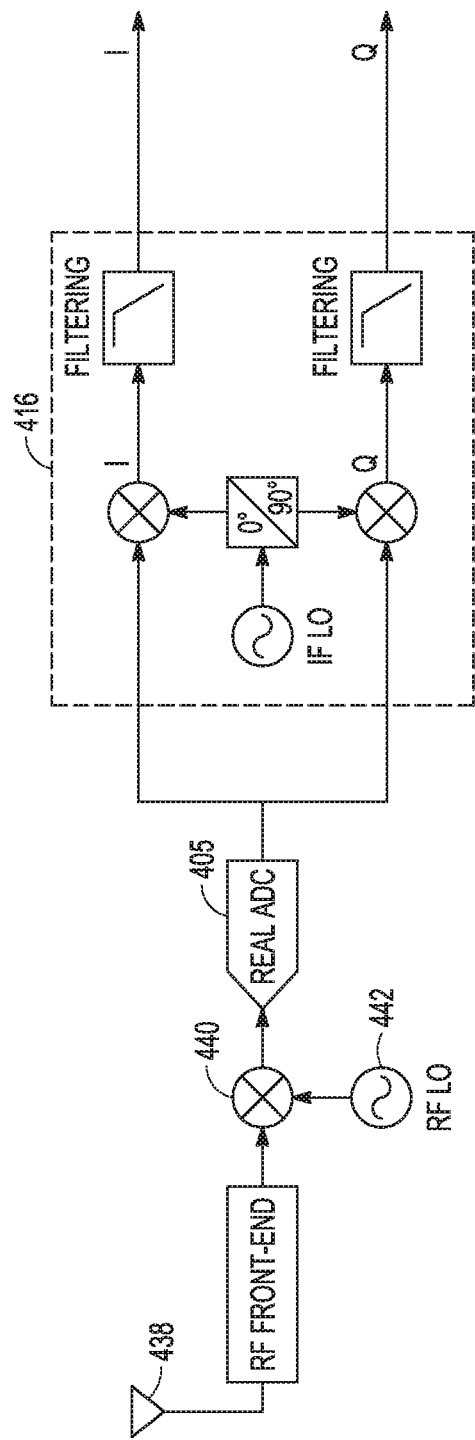
FIG. 4 is a schematic of portions of an example of a wireless communication device.

FIG. 4 is a circuit diagram of portions of an example of a receiver chain of a wireless communication device. The device 400 includes a radio frequency (RF) antenna 438, a receiver front end that can include an RF transceiver circuit (including mixer 440 and local oscillator 442), a delta sigma ADC circuit 405, and baseband circuitry 416. The delta sigma ADC circuit 416 can be any of the delta-sigma ADC circuit examples described herein. The delta-sigma ADC circuit 405 includes a loop filter circuit, main quantizer circuit, and a feedback circuit path coupled from the output of an integrator stage of the loop filter to the input of the sigma-delta ADC circuit integrator stages of the loop filter circuit. The dynamic range of the delta sigma ADC circuit 405 can be improved when the baseband circuitry activates the feedback circuit path to subtract an output voltage of the first integrator stage from the input of the delta-sigma ADC circuit when the input voltage increases to cause distortion in the delta-sigma ADC.

Figure 5:
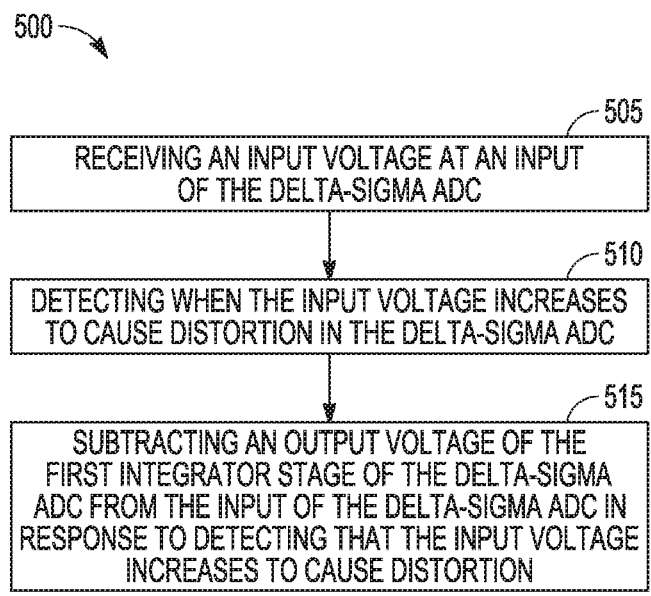
FIG. 5 is a flow diagram of a method of controlling operation of a delta-sigma ADC.

FIG. 5 is a flow diagram of a method of controlling operation of a delta-sigma ADC, such as in the wireless communication device of FIG. 4 for example. At 505, an input voltage at an input of the delta-sigma ADC, wherein the delta-sigma ADC includes a plurality of integrator stages including a first integrator stage. The integrator stages may be included in a loop filter circuit. At 510, it is determined when the input voltage increases to cause distortion in the delta-sigma ADC. The determination may be made using baseband circuitry. At 515, the output voltage of the first integrator stage is subtracted from the input of the delta-sigma ADC in response to the detecting when the input voltage increases to a point that causes distortion in the delta-sigma ADC. The subtracted output voltage may be added back in to the delta-sigma ADC at the output to restore the intended performance of the delta-sigma ADC.

The several devices and methods described herein improve the dynamic range of a delta-sigma ADC and reduce distortion.

ADDITIONAL DESCRIPTION AND EXAMPLES

Example 1 includes subject matter (such as an apparatus) comprising a delta-sigma analog-to-digital converter (ADC) and baseband circuitry. The ADC includes a plurality of integrator stages connected in series, including a first integrator stage operatively coupled to an input of the delta-sigma ADC; a main quantizer circuit including a main ADC circuit, wherein an input to the main ADC circuit is operatively coupled to the plurality of integrator stages; and a first feedback circuit path operatively coupled from an output of the first integrator stage to the input of the delta-sigma ADC, wherein the first feedback circuit path is configured to subtract an output voltage of the first integrator stage from the input of the delta-sigma ADC. The baseband circuitry is operatively coupled to the first feedback circuit path and configured to activate the first feedback circuit path when detecting that the input voltage increases to cause distortion in the delta-sigma ADC.

In Example 2, the subject matter of Example 1 optionally includes the first feedback circuit path including a first feedback quantizer circuit configured to quantize the output of the first integrator stage, and the first feedback circuit path subtracts a quantized output of the first integrator stage from the input of the sigma-delta ADC when activated.

In Example 3, the subject matter of Example 2 optionally includes the first feedback quantizer circuit including a sub-ADC circuit, and the output of the first integrator stage is operatively coupled to the input of the sub-ADC circuit.

In Example 4, the subject matter of one or both of Examples 2 and 3 optionally includes a first feed forward circuit path operatively coupled to the first feedback quantizer and a summing circuit node at the output of the delta-sigma ADC, wherein the first feed forward circuit path is configured to add the quantized output of the first integrator stage to the output using the circuit summing node when the first feedback circuit path is activated.

In Example 5, the subject matter of one or any combination of Examples 1-4 optionally includes a second integrator stage operatively coupled to the output of the first integrator stage; and a second feedback circuit path operatively coupled from the output of the second integrator stage to the input of the second integrator stage, wherein the second feedback circuit path is configured to subtract an output voltage of the second integrator stage from the input of the second integrator stage, and wherein the baseband circuitry is configured to activate the second feedback circuit path when detecting that the input voltage increases to cause distortion in the delta-sigma ADC.

In Example 6, the subject matter of Example 5 optionally includes the second feedback circuit path including a second feedback quantizer circuit and the second feedback circuit path is configured to subtract a quantized output of the second integrator stage from the input of the second integrator stage when activated.

In Example 7, the subject matter of Example 6, optionally includes a second feed forward circuit path operatively coupled to the second feedback quantizer and a summing circuit node at the output of the delta-sigma ADC circuit, wherein the second feed forward circuit path is configured to add the quantized output of the second integrator stage to the output using the circuit summing node when the second feedback circuit path is activated.

In Example 8, the subject matter of one or any combination of Examples 1-7 optionally includes baseband circuitry configured to detect when a signal to noise plus distortion ratio (SNDR) is less than a specified SNDR threshold, and activate the first feedback circuit path in response to the detection.

In Example 9, the subject matter of one or any combination of Examples 1-8 optionally includes wherein the ADC circuit is included in a receiver chain, and wherein the baseband circuitry is configured to detect when a bit error rate of a receiver chain is greater than a threshold bit error rate, and activate the first feedback circuit path in response to the detection.

In Example 10, the subject matter of one or any combination of Examples 1-9 optionally includes the plurality of integrator stages are included in a loop filter circuit of the delta-sigma ADC and the first feedback circuit path is configured to subtract the output voltage of the first integrator stage of the loop filter circuit from the input of the sigma-delta ADC when activated.

In Example 11, the subject matter of one or any combination of Examples 1-10 optionally includes the delta-sigma ADC being a one-bit delta-sigma ADC circuit.

Example 12 includes subject matter (such as a method of controlling operation of a delta-sigma ADC), or can optionally be combined with the subject matter of one or any combination of Examples 1-11 to include such subject matter, comprising: receiving an input voltage at an input of the delta-sigma ADC, wherein the delta-sigma ADC includes a plurality of integrator stages including a first integrator stage; detecting when the input voltage increases to cause distortion in the delta-sigma ADC; and subtracting an output voltage of the first integrator stage from the input of the delta-sigma ADC in response to the detecting when the input voltage increases to cause distortion.

In Example 13, the subject matter of Example 12 optionally includes quantizing the output of the first integrator stage and subtracting the quantized output from the input of the sigma-delta ADC.

In Example 14, the subject matter of Example 13 optionally includes adding the quantized output voltage of the first integrator stage to the output of the sigma-delta ADC circuit.

In Example 15, the subject matter of one or any combination of Examples 12-14 optionally includes receiving the output voltage of the first integrator stage at an input to a second integrator stage of the plurality of integrator stages; and subtracting an output voltage of the second integrator stage from the input of the second integrator stage in response to the detecting when the input voltage increases to cause distortion.

In Example 16, the subject matter of Example 15 optionally includes quantizing the output of the second integrator stage and subtracting the quantized output from the input of the second integrator.

In Example 17, the subject matter of Example 16 optionally includes adding the quantized output voltage of the second integrator stage to the output of the sigma-delta ADC circuit.

In Example 18, the subject matter of one or any combination of Examples 12-17 optionally includes detecting when a signal to noise plus distortion ratio (SNDR) is less than a specified SNDR threshold.

In Example 19, the subject matter of one or any combination of Examples 12-18 optionally includes detecting when a bit error rate of the delta-sigma ADC is greater than a threshold bit error rate value.

In Example 20, the subject matter of one or any combination of Examples 12-19 optionally includes the plurality of integrator stages are included in a loop filter circuit of the delta-sigma ADC and wherein the subtracting the output voltage of the first integrator stage includes subtracting the output voltage of the first integrator stage of the loop filter circuit from the input of the sigma-delta ADC.

Example 21 can include subject matter (such as a wireless communication device), or can optionally be combined with the subject matter of one or any combination of Examples 1-20 to include such subject matter, comprising: a radio frequency (RF) transceiver circuit; a delta-sigma analog-to-digital converter (ADC) including: a loop filter circuit including a plurality of integrator stages connected in series, including a first integrator stage operatively coupled to an input of the delta-sigma ADC; a main quantizer circuit including a main ADC circuit and a main digital-to-analog converter (DAC) circuit, wherein an input to the main ADC circuit is operatively coupled to the loop filter circuit; and a first feedback circuit path operatively coupled from an output of the first integrator stage to the input of the delta-sigma ADC, wherein the first feedback circuit path is configured to subtract an output voltage of the first integrator stage from the input of the delta-sigma ADC; and baseband circuitry operatively coupled to the first feedback circuit path and configured to activate the first feedback circuit path when detecting that the input voltage increases to cause distortion in the delta-sigma ADC.

In Example 22, the subject matter of Example 21 optionally includes the first feedback circuit path includes a first feedback quantizer circuit configured to quantize the output of the first integrator stage, and the first feedback circuit path subtracts a quantized output of the first integrator stage from the input of the sigma-delta ADC when activated.

In Example 23, the subject matter of one or both of Examples 21 and 22 optionally includes a second integrator stage operatively coupled to the output of the first integrator stage; and a second feedback circuit path operatively coupled from the output of the second integrator stage to the input of the second integrator stage, wherein the second feedback circuit path is configured to subtract an output voltage of the second integrator stage from the input of the second integrator stage, and wherein the baseband circuitry is configured to activate the second feedback circuit path when detecting that the input voltage increases to cause distortion in the delta-sigma ADC.

In Example 24, the subject matter of one or any combination of Examples 21-22 optionally includes an RF antenna operatively coupled to the RF transceiver circuit.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
a delta-sigma analog-to-digital converter (ADC) including:
a plurality of integrator stages connected in series, including a first integrator stage operatively coupled to an input of the delta-sigma ADC;
a main quantizer circuit including a main ADC circuit, wherein an input to the main ADC circuit is operatively coupled to the plurality of integrator stages; and
a first feedback circuit path operatively coupled from an output of the first integrator stage to the input of the delta-sigma ADC, wherein the first feedback circuit path is configured to subtract an output voltage of the first integrator stage from the input of the delta-sigma ADC; and
baseband circuitry operatively coupled to the first feedback circuit path and configured to activate the first feedback circuit path when detecting that the input voltage increases to cause distortion in the delta-sigma ADC.

2. The apparatus of claim 1, wherein the first feedback circuit path includes a first feedback quantizer circuit configured to quantize the output of the first integrator stage, and the first feedback circuit path subtracts a quantized output of the first integrator stage from the input of the sigma-delta ADC when activated.

3. The apparatus of claim 2, wherein the first feedback quantizer circuit includes a sub-ADC circuit, and the output of the first integrator stage is operatively coupled to the input of the sub-ADC circuit.

4. The apparatus of claim 2, including a first feed forward circuit path operatively coupled to the first feedback quantizer and a summing circuit node at the output of the delta-sigma ADC circuit, wherein the first feed forward circuit path is configured to add the quantized output of the first integrator stage to the output using the circuit summing node when the first feedback circuit path is activated.

5. The apparatus of claim 1, including a second integrator stage operatively coupled to the output of the first integrator stage; and a second feedback circuit path operatively coupled from the output of the second integrator stage to the input of the second integrator stage, wherein the second feedback circuit path is configured to subtract an output voltage of the second integrator stage from the input of the second integrator stage, and wherein the baseband circuitry is configured to activate the second feedback circuit path when detecting that the input voltage increases to cause distortion in the delta-sigma ADC.

6. The apparatus of claim 5, wherein the second feedback circuit path includes a second feedback quantizer circuit and the second feedback circuit path is configured to subtract a quantized output of the second integrator stage from the input of the second integrator stage when activated.

7. The apparatus of claim 6, including a second feed forward circuit path operatively coupled to the second feedback quantizer and a summing circuit node at the output of the delta-sigma ADC circuit, wherein the second feed forward circuit path is configured to add the quantized output of the second integrator stage to the output using the circuit summing node when the second feedback circuit path is activated.

8. The apparatus of claim 1, wherein the baseband circuitry is configured to detect when a signal to noise plus distortion ratio (SNDR) is less than a specified SNDR threshold, and activate the first feedback circuit path in response to the detection.

9. The apparatus of claim 1, wherein the baseband circuitry is configured to detect when a bit error rate of the receiver chain is greater than a threshold bit error rate, and activate the first feedback circuit path in response to the detection.

10. The apparatus of claim 1, wherein the plurality of integrator stages are included in a loop filter circuit of the delta-sigma ADC and the first feedback circuit path is configured to subtract the output voltage of the first integrator stage of the loop filter circuit from the input of the sigma-delta ADC when activated.

11. The apparatus of claim 1, wherein the delta-sigma ADC circuit is a one-bit delta-sigma ADC circuit.

12. A method of controlling operation of a delta-sigma analog-to-digital converter (ADC), the method comprising:
receiving an input voltage at an input of the delta-sigma ADC, wherein the delta-sigma ADC includes a plurality of integrator stages including a first integrator stage;
detecting when the input voltage increases to cause distortion in the delta-sigma ADC; and
subtracting an output voltage of the first integrator stage from the input of the delta-sigma ADC in response to the detecting when the input voltage increases to cause distortion.

13. The method of claim 12, wherein the subtracting the output voltage of the first integrator stage from the input of the delta-sigma ADC includes quantizing the output of the first integrator stage and subtracting the quantized output from the input of the sigma-delta ADC.

14. The method of claim 13, including adding the quantized output voltage of the first integrator stage to the output of the sigma-delta ADC circuit.

15. The method of claim 12, including:
receiving the output voltage of the first integrator stage at an input to a second integrator stage of the plurality of integrator stages; and
subtracting an output voltage of the second integrator stage from the input of the second integrator stage in response to the detecting when the input voltage increases to cause distortion.

16. The method of claim 15, wherein the subtracting the output voltage of the second integrator stage includes quantizing the output of the second integrator stage and subtracting the quantized output from the input of the second integrator.

17. The method of claim 16, including adding the quantized output voltage of the second integrator stage to the output of the sigma-delta ADC circuit.

18. The method of claim 12, wherein the detecting when the input voltage increases to cause distortion in the delta-sigma ADC includes detecting when a signal to noise plus distortion ratio (SNDR) is less than a specified SNDR threshold.

19. The method of claim 12, wherein the detecting when the input voltage increases to cause distortion in the delta-sigma ADC includes detecting when bit error rate of the receiver chain is greater than a threshold bit error rate value.

20. The method of claim 12, wherein the plurality of integrator stages are included in a loop filter circuit of the delta-sigma ADC and wherein the subtracting the output voltage of the first integrator stage includes subtracting the output voltage of the first integrator stage of the loop filter circuit from the input of the sigma-delta ADC.

21. A wireless communication device comprising:
a radio frequency (RF) transceiver circuit;
a delta-sigma analog-to-digital converter (ADC) including:
a loop filter circuit including a plurality of integrator stages connected in series, including a first integrator stage operatively coupled to an input of the delta-sigma ADC;
a main quantizer circuit including a main ADC circuit and a main digital-to-analog converter (DAC) circuit, wherein an input to the main ADC circuit is operatively coupled to the loop filter circuit; and
a first feedback circuit path operatively coupled from an output of the first integrator stage to the input of the delta-sigma ADC, wherein the first feedback circuit path is configured to subtract an output voltage of the first integrator stage from the input of the delta-sigma ADC; and
baseband circuitry operatively coupled to the first feedback circuit path and configured to activate the first feedback circuit path when detecting that the input voltage increases to cause distortion in the delta-sigma ADC.

22. The wireless communication device of claim 21, wherein the first feedback circuit path includes a first feedback quantizer circuit configured to quantize the output of the first integrator stage, and the first feedback circuit path subtracts a quantized output of the first integrator stage from the input of the sigma-delta ADC when activated.

23. The wireless communication device of claim 21, including a second integrator stage operatively coupled to the output of the first integrator stage; and a second feedback circuit path operatively coupled from the output of the second integrator stage to the input of the second integrator stage, wherein the second feedback circuit path is configured to subtract an output voltage of the second integrator stage from the input of the second integrator stage, and wherein the baseband circuitry is configured to activate the second feedback circuit path when detecting that the input voltage increases to cause distortion in the delta-sigma ADC.

24. The wireless communication device of claim 21, including an RF antenna operatively coupled to the RF transceiver circuit.

* * * * *